(12) United States Patent
Hou et al.

(10) Patent No.: US 7,288,004 B1
(45) Date of Patent: Oct. 30, 2007

(54) MEMORY STICK CONVERT DEVICE

(75) Inventors: Yu-Ling Hou, Jhubei (TW); Hsien-Ming Chang, Tucheng (TW)

(73) Assignees: Siliconmotion Inc., Jhubei (TW); Casion Technology Co., Ltd, Tucheng (TW)

( * ) Notice: Subject to any disclaimer, the term of this patent is extended or adjusted under 35 U.S.C. 154(b) by 0 days.

(21) Appl. No.: 11/443,019

(22) Filed: May 31, 2006

(30) Foreign Application Priority Data

Apr. 12, 2006 (TW) .............................. 95206199 U

(51) Int. Cl.
*H01R 24/00* (2006.01)
(52) U.S. Cl. ..................... 439/630; 439/638; 439/945
(58) Field of Classification Search ................ 439/638, 439/945, 946; 361/737
See application file for complete search history.

(56) References Cited

U.S. PATENT DOCUMENTS

| 7,025,637 | B1 * | 4/2006 | Lee ............................. 439/638 |
| 7,118,421 | B2 * | 10/2006 | Kadonaga et al. .......... 439/638 |
| 2005/0185371 | A1 * | 8/2005 | Kuroda et al. .............. 361/684 |
| 2006/0149855 | A1 * | 7/2006 | Fukuda .......................... 710/2 |
| 2007/0004285 | A1 * | 1/2007 | Lee ............................. 439/638 |

* cited by examiner

*Primary Examiner*—Hae Moon Hyeon
(74) *Attorney, Agent, or Firm*—Birch, Stewart, Kolasch & Birch, LLP

(57) ABSTRACT

A memory stick convert device includes an upper housing and lower housing and a convert interface. An assembly of the upper housing and the lower housing has the same type of connector as the Memory Stick(Pro) Duo does at an end. The assembly includes a cavity to accommodate a Micro-SD stick. The convert interface is sandwiched between the upper housing and the lower housing to convert signal formats between the Memory Stick (Pro) Duo and the Micro-SD.

16 Claims, 4 Drawing Sheets

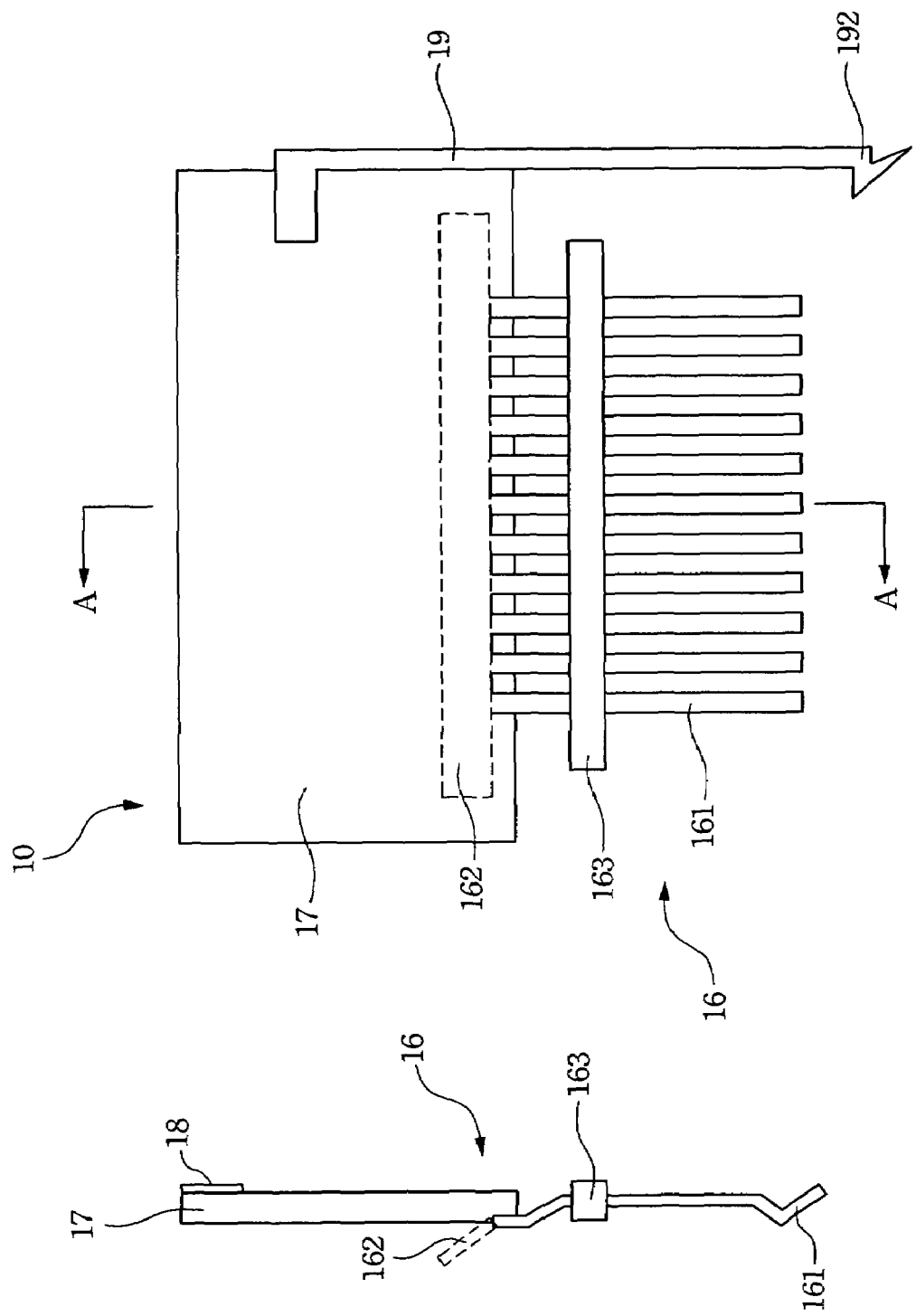

MEMORY STICK CONVERT DEVICE

RELATED APPLICATIONS

The present application is based on, and claims priority from, Taiwan Application Serial Number 95206199, filed Apr. 12, 2006, the disclosure of which is hereby incorporated by reference herein in its entirety.

BACKGROUND OF THE INVENTION

1. Field of Invention

The invention relates to a memory stick convert device and, in particular, to a memory stick convert device that convert signal formats between the Micro-SD stick and the Memory Stick (Pro) Duo.

2. Related Art

Currently, there are many memory sticks on the market for data storage, such as Micro-SD, Trans Flash, and Memory Stick (Pro) Duo. When a user purchases a portable electronic product, he/she has to choose one that is compatible with the type of his/her original memory stick. Otherwise, additional memory sticks have to be purchased also. Such a situation causes a lot of inconvenience. To solve the problem, it is necessary to provide a convert device among all the memory sticks. However, no such a device is available for the Micro-SD, Trans Flash, and Memory Stick (Pro) Duo up to date.

SUMMARY OF THE INVENTION

Therefore, the invention provides a memory stick convert device for converting signal formats between the Micro-SD and the Memory Stick (Pro) Duo.

To achieve the above objective, the disclosed memory stick convert device includes a lower housing, an upper housing, and a convert interface. An assembly of the upper housing and the lower housing has the same type of connector as the Memory Stick (Pro) Duo does at an end. The assembly includes a cavity to accommodate a Micro-SD stick. The convert interface is sandwiched between the upper housing and the lower housing to convert signal formats between the Memory Stick (Pro) Duo and the Micro-SD.

The convert interface includes a substrate, a connecting chip, a tab terminal, and an elastic chip. The substrate is disposed with a convert control chip and a passive device for converting data formats for different memory sticks. The connecting chip is electrically coupled to the substrate and has a plurality of metal contacts, a connecting plate, and a positioning body. The connecting plate and the metal contacts are connected. The connecting chip is welded to the back of the substrate, separating the connecting plate. The positioning body is formed by ejection formation at the center of the metal contacts. The tab terminal is disposed on the substrate, electrically connecting to the contacts of the Micro-SD stick via the connecting chip. The elastic chip is a narrow, long structure disposed on one side of the substrate. One of its ends is fixed on the substrate. The other end is formed with a protrusion coupled to the recessed portion on the side of the Micro-SD. The tab contacts and the apparatus inserted into the memory stick convert device are electrically coupled. The circuit on the substrate converts the signal formats among different memory sticks and transmits signals.

The lower housing includes a position guider, a recessed portion, an indention, a first lower housing space, a second lower housing space, a third lower housing space, a plurality of terminal slots, and an elastic plate slot. The position guider is disposed on one corner of the lower housing. The recessed portion is on one side of the position guider, the central portion along the long side of the lower housing. The indention is at the center of the lower edge of the lower housing. The first lower housing space, the second lower housing space, and the third lower housing space are formed in sequence as one goes from the indention into the lower housing. The first lower housing space accommodates the Micro-SD stick inserted into the memory stick convert device. The second lower housing space accommodates the connecting chip of the convert interface and the terminal of the Micro-SD stick inserted into the memory stick convert device. The third lower housing space accommodates the substrate of the convert interface. The terminal slots are disposed above the third lower housing space, so as to expose the tab contact of the convert interface. The elastic chip space is formed on one side of the lower housing, next to the first lower housing space and the second lower housing space, to accommodate the elastic chip. The elastic chip space includes a pressing portion and an indention. The pressing portion is at the central portion of the elastic chip space, pressing the elastic chip toward the direction of the first lower housing space and the second lower housing space. The indention is disposed at the bottom of the elastic chip space at a position corresponding to the elastic chip protrusion, so that the elastic chip protrusion protrudes from the elastic chip space. The height of the second lower housing space is smaller than that of the first lower housing space.

The first lower housing space further has an internal position guider and an edge. The internal position guider is disposed at the central portion of one side of the first lower housing space. The internal position guider and the position guider of the Micro-SD stick inserted into the memory stick convert device together provide a correct insertion direction. The edge is on the other side of the first lower housing space, so that the Micro-SD stick slides along the edge into the memory stick convert device.

Corresponding to the lower housing, the upper housing has a position guider, a recessed portion, an indention, a first upper housing space, a second upper housing space, and an elastic chip space. The position guider is disposed on one corner of the upper housing. The recessed portion is on one side of the position guider, at the central portion of the long side of the upper housing. The indention is at the center of the lower edge of the upper housing and includes an arc recessed portion. The first upper housing space and the second upper housing space are formed in sequence from the indention into the upper housing. The first upper housing space accommodates the Micro-SD stick inserted into the memory stick convert device. The second upper housing space accommodates the substrate of the convert interface. The elastic chip space is on the side of the upper housing next to the first upper housing space for accommodating the elastic chip. It has a pressing portion and an indention. The pressing portion is in the central portion of the elastic chip space, pressing the elastic chip toward the direction of the first upper housing space. The indention of the elastic chip space is at its bottom corresponding to the elastic chip protrusion, so that the elastic chip protrudes from the elastic chip space.

The first upper housing space further has an internal position guider, an edge, and a terminal edge. The internal position guider is disposed in the central portion of an edge of the first upper housing space. The internal position guider and the position guider of the Micro-SD stick together provide a correction insertion direction. The edge is on the other side of the first upper housing space, so that the Micro-SD stick slides along the edge into the memory stick convert device. The terminal edge is at a position corresponding to the indention. The terminal edge and the internal position guider restrict the depth that the Micro-SD stick can be inserted.

The lower housing has a lower housing side ridge, and the upper housing has an upper housing side ridge. The lower housing side ridge and the upper housing side ridge are on the left and right edges of the lower and upper housings, respectively for the assembly of the upper housing and the lower housing.

The Micro-SD stick is compatible with the Trans Flash stick. Therefore, not only can the disclosed memory stick convert device convert the signal formats between the Micro-SD and the Memory Stick (Pro) Duo, it also converts the signal formats between the Trans Flash and the Memory Stick (Pro) Duo.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein:

FIG. 2 contains a top view and an A-A cross-sectional view of the memory stick convert device;

DETAILED DESCRIPTION OF THE INVENTION

The present invention will be apparent from the following detailed description, which proceeds with reference to the accompanying drawings, wherein the same references relate to the same elements.

Figures 3, 4:
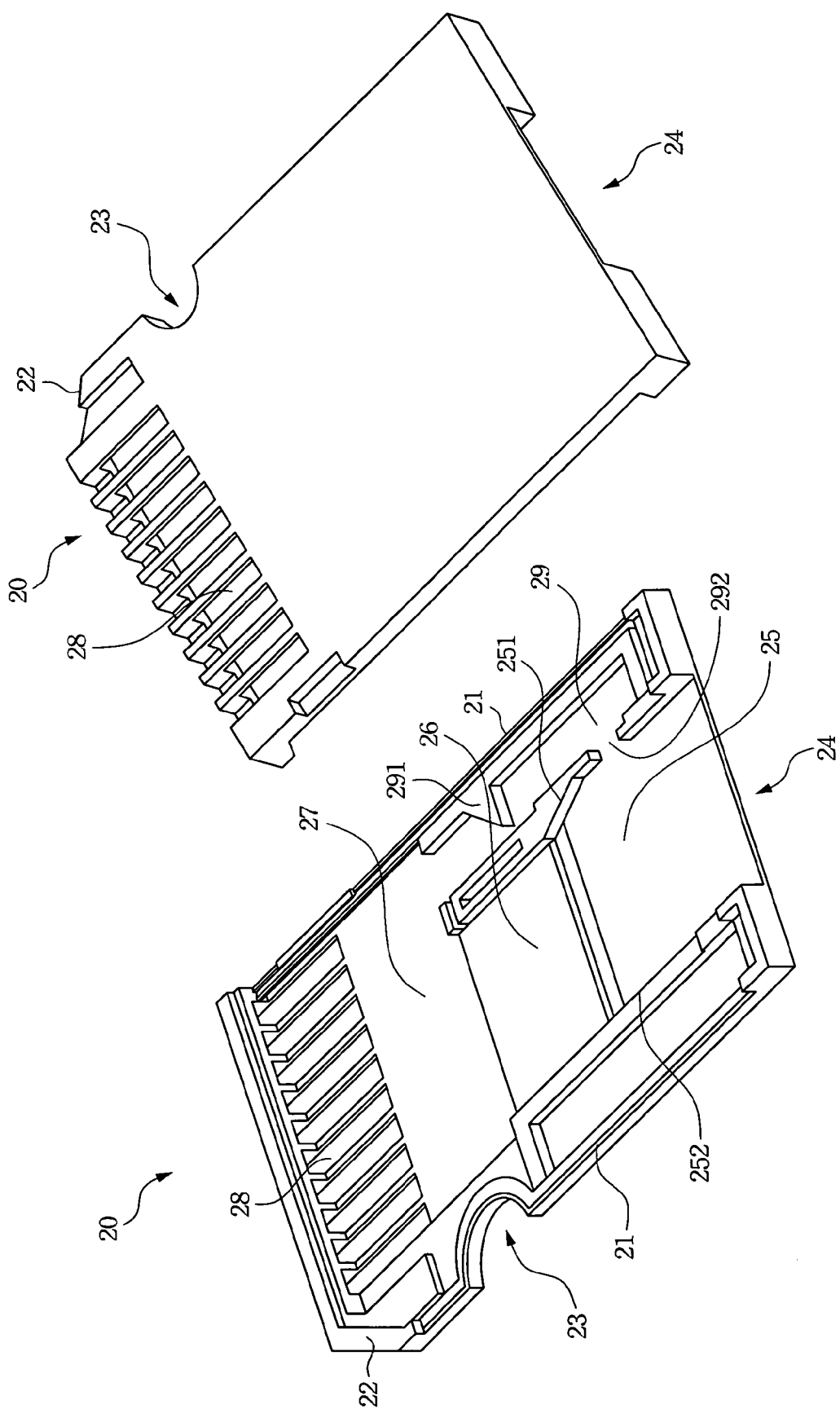
FIG. 3 is a three-dimensional view of one side of the lower housing of the invention.
FIG. 4 is a three-dimensional view of the other side of the lower housing of the invention.

The directions referred herein are based upon the drawings of the specification. For example, as shown in FIG. 3, the contact slots 28 are disposed in parallel on the lower housing 20. Other position relations can be understood in the same way.

Figure 1:
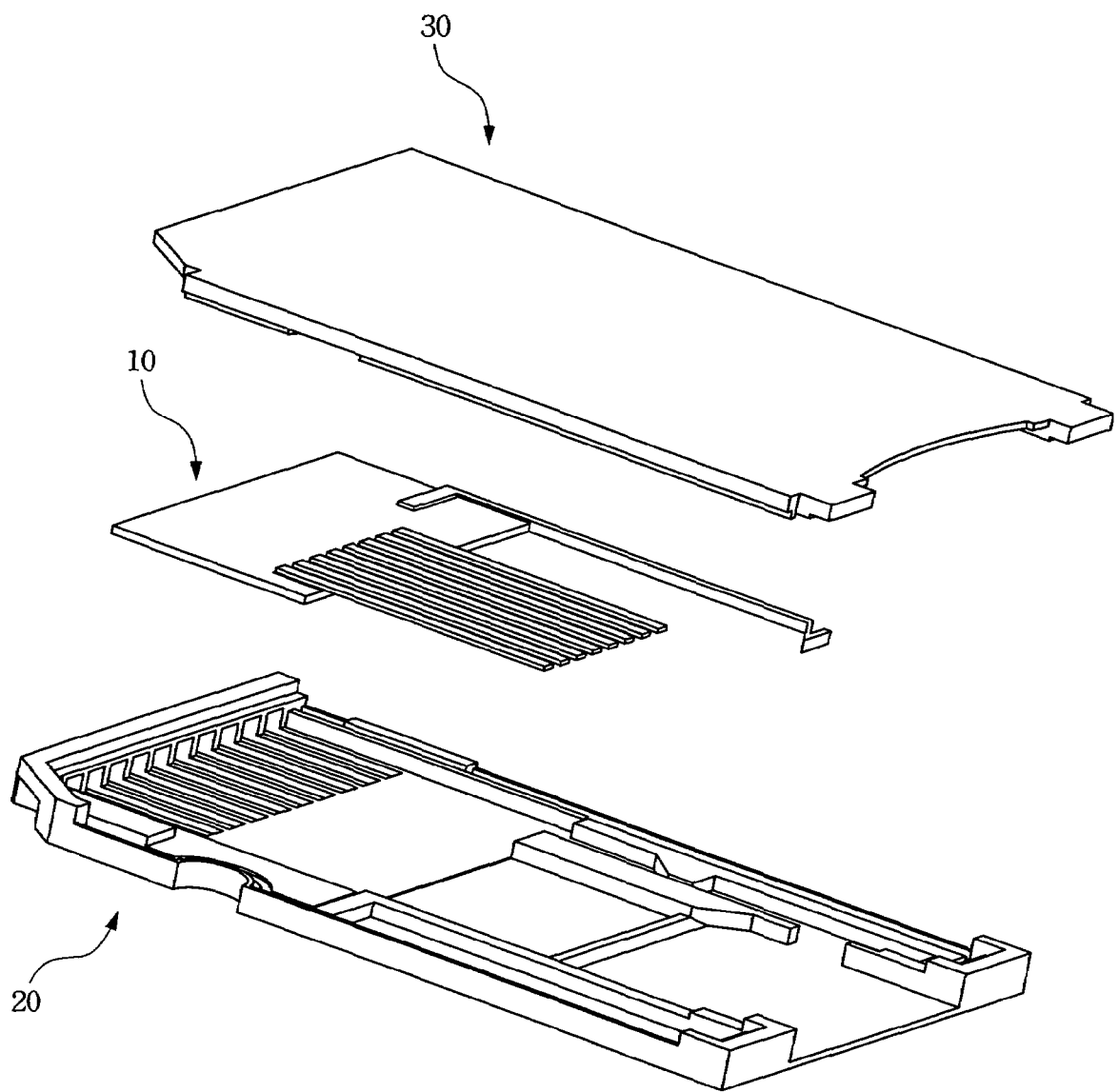
FIG. 1 is a three-dimensional exploded view of the disclosed memory stick convert device.

As shown in FIG. 1, the disclosed memory stick convert device includes a convert interface 10, a lower housing 20, and an upper housing 30. After the assembly of the lower housing 20 and the upper housing 30, the size is the same as the Memory Stick (Pro) Duo stick. The convert interface 10 is sandwiched between the lower housing 20 and the upper housing 30 to convert the signal formats between the Micro-SD and the Memory Stick (Pro) Duo.

As shown in FIG. 2, the convert interface 10 includes a connecting chip 16, a substrate 17, a tab terminal 18, and an elastic chip 19. The substrate 17 is disposed with a signal convert control chip and passive device for converting data formats for different memory sticks. The connecting chip 16 includes several metal contacts 161, a connecting plate 162, and a positioning body 163. The metal contacts 161 and the connecting plate 162 are an integrally formed metal device. The positioning body 163 is formed by plastic ejection formation in the central portion of the metal contacts 161. In addition to fixing the positions of the metal contacts 161, the positioning body 163 can prevent the soldering tin from flowing to the front ends of the metal contacts 161 when the connecting chip 16 is welded to the substrate 17. Therefore, it can avoid short circuits with the metal contacts 161. After the metal contacts 161 are soldered onto the circuit on the substrate 17, the connecting plate 162 is removed, leaving the metal contacts 161 as independent metal contacts. The tab terminal 18 is disposed on the substrate for electrically connecting to the Micro-SD contacts via the connecting chip 16. The tab contacts 18 are electrically connected to the device inserted into the memory stick convert device, using the circuit on the substrate 17 to convert and transmit signal formats between different memory sticks. The elastic chip 19 is a narrow, long structure disposed on the side of the substrate 17. One of its ends is fixed on the substrate 17, and the other end is formed with a protrusion 192 coupled to the recessed portion on the side of the Micro-SD.

As shown in FIGS. 3 and 4, one corner of the lower housing 20 is disposed with the position guider 22. The recessed portion 23 is formed on one side of the position guider 22, in the central portion of the long side of the lower housing 20. When the disclosed memory stick convert device is inserted into a device, the recessed portion 23 matches with a protruding portion on the device. An indention 24 is formed at the center of the lower edge of the lower housing 20. The first lower housing space 25, the second lower housing space 26, and the third lower housing space 27 are formed in sequence from the indention 24 into the lower housing 20. The indention 24 receives the insertion of the Micro-SD, accommodating the inserted memory stick in the first lower housing space 25. The second lower housing space 26 accommodates the connecting chip 16 of the convert interface 10 and the terminal of the inserted Micro-SD. The connecting chip 16 and the terminal of the Micro-SD are electrically coupled inside the second lower housing space 26. The third lower housing space 27 accommodates the substrate 17 of the convert interface 10. To ensure a good electrical connection between the connecting chip 16 and the inserted memory stick, the height of the second lower housing space 26 is smaller than the height of the first lower housing space 25. For example, the height of the second lower housing space 26 is 0.2 mm, and the first lower housing space 25 is 0.25 mm. Several parallel terminal slots 28 are formed on the third lower housing space 27, exposing the tab contacts 18 of the convert interface 10. When the disclosed memory stick convert device is inserted into the device, the tab contacts 18 are in electrical contact with the device. The side of the lower housing 20 is formed with an elastic chip space 29, next to the first lower housing space 25 and the second lower housing space 26, to accommodate the elastic chip 19. The elastic chip space 29 has a pressing portion 291 and an indention 292. The pressing portion 291 is disposed in the central portion of the elastic chip space 29, pressing the elastic chip 19 toward the direction of the first lower housing space 25 and the second lower housing space 26. A larger elastic force is thus produced by the elastic chip 19 to maintain the position thereof. The indention 292 is at the bottom of the elastic chip space 29 at a position corresponding to the elastic chip protrusion 192. The elastic chip protrusion 192 protrudes from the elastic chip space 29 and touches the first lower housing space 25.

Figures 5, 6:
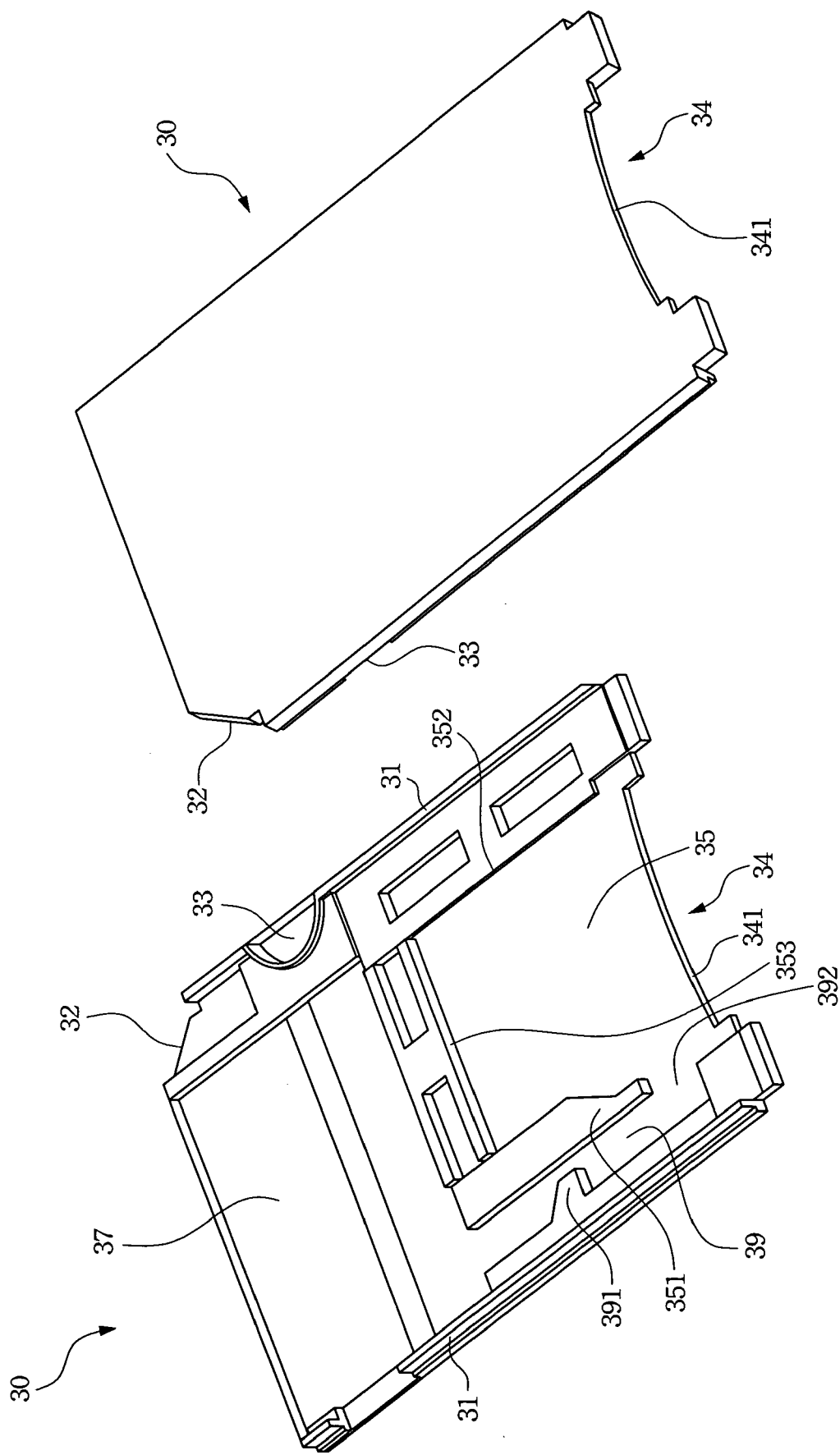
FIG. 5 is a three-dimensional view of one side of the upper housing of the invention.
FIG. 6 is a three-dimensional view of the other side of the upper housing of the invention.

As shown in FIGS. 5 and 6, the upper housing 30 and the lower housing 20 match with each other. One corner of the upper housing 30 is formed with a position guider 32. A recessed portion 33 is formed on one side of the position guider 32, in the central portion of the long side of the upper housing 30. An indention 34 is formed on the lower edge of the upper housing 30. The indention 34 has an arc recessed portion 341 for accommodating the protrusion on the edge of the inserted Micro-SD and for the user to take out the inserted Micro-SD. The first upper housing space 35 and the second upper housing space 37 are formed in sequence from the indention 34 into the upper housing 30. The indention 34 receives the insertion of the Micro-SD, accommodating the inserted memory stick in the first upper housing space 35. The second upper housing space 37 accommodates the substrate 17 of the convert interface 10. An elastic chip space 39 is formed on one side of the upper housing 30, next to the first upper housing space 35, to accommodate the elastic chip 19. The elastic chip space 39 has a pressing portion 391 and an indention 392. The pressing portion 391 is disposed in the central portion of the elastic chip space 39, pressing the elastic chip 19 toward the direction of the first lower housing space 35. A larger elastic force is thus produced by the elastic chip 19 to maintain the position thereof. The indention 392 is at the bottom of the elastic chip space 39 at a position corresponding to the elastic chip protrusion 192. The elastic chip protrusion 192 protrudes from the elastic chip space 39 and touches the first lower housing space 35.

After the assembly of the lower housing 20 and the upper housing 30, the third lower housing space 27 and the second upper housing space 37 form a space for accommodating the convert interface 10. The first lower housing space 25, the second lower housing space 26, and the first upper housing space 35 forms space for accommodating the Micro-SD. The elastic chip spaces 29, 39 accommodate the elastic chip 19. The first lower housing space 25 contains an internal position guider 251 and an edge 252. Correspondingly, the first upper housing space 35 contains an internal position guider 351 and an edge 352. The internal position guiders 251, 351 are in the central positions of corresponding sides of the first lower housing space 25 and first upper housing space 35. The internal position guiders 251, 351 and the position guider of the Micro-SD act together to provide a correct insertion direction. The edges 252, 352 are on the other corresponding sides of the first lower housing space 25 and the first upper housing space 35. The inserted memory stick slides along the edges 252, 352. When the inserted memory stick touches the elastic chip protrusion 192 that protrudes from the indentions 292, 392, a force is then imposed for the elastic chip protrusion 192 to go inside the indentions 292, 392. Once the recessed portion on the side of the memory stick moves by the indention, the elastic force of the elastic chip 19 pushes the elastic chip protrusion 192 out of the indentions 292, 392, matching with the recessed portion on the side of the memory stick. This enhances the insertion stability between the memory stick and the disclosed memory stick convert device. The first upper housing space 35 further contains a terminal edge 353 at a position corresponding to the indention 34. The terminal edge 353 along with the position guiders 251, 351 restrict the depth that the memory stick can be inserted, so that the connecting chip 16 and the inserted Micro-SD have a good electrical connection. The lower housing has a lower housing side ridge 21, and the upper housing 30 has an upper housing side ridge 31. The lower housing side ridge 21 and the upper housing side ridge 31 are on the left and right edges of the lower housing 20 and the upper housing 30, respectively. The assembly between the lower housing 20 and the upper housing 30 can be achieved by employing ultrasonic welding to combine the lower housing side ridge 21 and the upper housing side ridge 31. Alternatively, the assembly can be achieved by buckling up or adhering the lower housing side ridge 21 and the upper housing side ridge 31.

The Micro-SD stick and the Trans Flash stick have the same format. Therefore, not only can the disclosed memory stick convert device convert the signal formats between the Micro-SD and the Memory Stick (Pro) Duo, it can also convert the signal formats between the Trans Flash and the Memory Stick (Pro) Duo.

As described in the above preferred embodiments, the invention can convert the signal formats among the Micro-SD, the Trans Flash, and the Memory Stick (Pro) Duo. It is convenient for the user to convert data among different memory sticks.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A memory stick convert device, comprising:
   a lower housing;
   an upper housing; and
   a convert interface, sandwiched between the lower housing and the upper housing for converting signal formats between a Micro-SD and a Memory Stick (Pro) Duo;
   wherein the convert interface contains a substrate, installed with a signal convert control chip and a passive device for converting data formats of different memory sticks, and an assembly of the lower housing and the upper housing has the same type of connector as the Memory Stick (Pro) Duo does at an end, and contains a space for accommodating the Micro-SD stick.

2. The memory stick convert device of claim 1, wherein the convert interface contains:
   a connecting chip, electrically coupled to the substrate and including:
      a plurality of metal elastic chips;
      a connecting plate, connected to the metal elastic chips and separated from the connecting chip after the connecting chip is soldered onto the substrate; and
      a positioning body, formed by ejection formation in the central portion of the metal elastic chips;
   a tab terminal, disposed on the substrate; and
   an elastic chip, having a narrow and long structure and disposed on one side of the substrate, with one end fixed on the substrate and the other end formed with a protrusion that matches with a recessed portion on the side of the Micro-SD;
   wherein the connecting chip is electrically coupled to the contacts on the Micro-SD stick, thereby electrically connecting the tab terminal with the device inserted into the memory stick convert device; and a circuit on the substrate converts and transmits the signal formats between different memory sticks.

3. The memory stick convert device of claim 2, wherein the lower housing includes:
   a position guider, disposed on one corner thereof;
   a recessed portion, formed on one side of the position guider and in the central portion of the long side thereof;
   an indention, formed at the center of a lower edge thereof;
   a first lower housing space for accommodating the Micro-SD stick inserted into the memory stick convert device;
   a second lower housing space for accommodating the connecting chip of the convert interface and the terminal of the Micro-SD stick inserted into the memory stick convert device;
   a third lower housing space for accommodating the substrate of the convert interface, wherein the first lower housing space, the second lower housing space, and the third lower housing space are formed in sequence from the indention into the lower housing;
   a plurality of terminal slots, disposed in parallel on the third lower housing space for exposing the tab terminal of the convert interface; and
   an elastic chip space, formed on one side of the lower housing next to the first lower housing space and the second lower housing space for accommodating the elastic chip, the elastic chip space containing:
      a pressing portion, disposed in the central portion of the elastic chip space to press the elastic chip toward the direction of the first lower housing space and the second lower housing space; and
      an indention, disposed at the bottom of the elastic chip space at a position corresponding to the elastic chip protrusion so that the elastic chip protrusion protrudes from the elastic chip space.

4. The memory stick convert device of claim 3, wherein the height of the second lower housing space is smaller than the height of the first lower housing space.

5. The memory stick convert device of claim 3, wherein the first lower housing space further contains:
   an internal position guider, disposed in the central portion of one side thereof and acting together with the position guider of the Micro-SD stick inserted into the memory stick convert device to provide a correct insertion direction; and
   an edge, on the other side of the first lower housing space, so that the Micro-SD stick slides along the edge into the memory stick convert device.

6. The memory stick convert device of claim 2, wherein the upper housing corresponds to the lower housing and contains:
   a position guider, disposed on one corner thereof;
   a recessed portion, formed on one side of the position guider and in the central portion of the long side thereof;
   an indention, formed at the center of the lower edge thereof;
   a first upper housing space for accommodating the Micro-SD stick inserted into the memory stick convert device;
   a second upper housing space for accommodating the substrate of the convert interface, wherein the first lower housing space and the second lower housing space are formed in sequence from the indention into the upper housing; and
   an elastic chip space, formed on one side of the upper housing next to the first lower housing space for accommodating the elastic chip, the elastic chip space containing:
      a pressing portion, disposed in the central portion of the elastic chip space to press the elastic chip toward the direction of the first upper housing space; and
      an indention, disposed at the bottom of the elastic chip space at a position corresponding to the elastic chip protrusion so that the elastic chip protrusion protrudes from the elastic chip space.

7. The memory stick convert device of claim 6, wherein the first upper housing space further contains:
   an internal position guider, disposed in the central portion of one side thereof and acting together with the position guider of the Micro-SD stick inserted into the memory stick convert device to provide a correct insertion direction;
   an edge, on the other side of the first tipper housing space, so that the Micro-SD stick slides along the edge into the memory stick convert device; and
   a terminal edge, formed at a position corresponding to the indention so that the terminal edge and the internal position guider restrict the insertion depth of the Micro-SD stick.

8. The memory stick convert device of claim 1, wherein the lower housing contains a lower housing side ridge and the upper housing contains an upper housing side ridge, the lower housing side ridge and the upper housing side ridge being formed on the left and right edges of the lower housing and the upper housing, respectively, for an assembly of the lower housing and the upper housing.

9. A memory stick convert device, comprising:
   a lower housing;
   an upper housing; and
   a convert interface, sandwiched between the lower housing and the upper housing for converting signal formats between a Trans Flash and a Memory Stick (Pro) Duo;
   wherein the convert interface contains a substrate, installed with a signal convert control chip and a passive device for converting data formats of different memory sticks, and an assembly of the lower housing and the upper housing has the same type of connector as the Memory Stick (Pro) Duo does at an end, and contains a space for accommodating the Trans Flash stick.

10. The memory stick convert device of claim 9, wherein the convert interface contains:
   a connecting chip, electrically coupled to the substrate and including:
      a plurality of metal elastic chips;
      a connecting plate, connected to the metal elastic chips and separated from the connecting chip after the connecting chip is soldered onto the substrate; and
      a positioning body, formed by ejection formation in the central portion of the metal elastic chips;
   a tab terminal, disposed on the substrate; and
   an elastic chip, having a narrow and long structure and disposed on one side of the substrate, with one end fixed on the substrate and the other end formed with a protrusion that matches with a recessed portion on the side of the Trans Flash;
   wherein the connecting chip is electrically coupled to the contacts on the Trans Flash stick, thereby electrically connecting the tab terminal with the device inserted into the memory stick convert device; and a circuit on the substrate converts and transmits the signal formats between different memory sticks.

11. The memory stick convert device of claim 10, wherein the lower housing includes:
   a position guider, disposed on one cornier thereof;
   a recessed portion, formed on one side of the position guider and in the central portion of the long side thereof;
   an indention, formed at the center of a lower edge thereof;
   a first lower housing space for accommodating the Trans Flash stick inserted into the memory stick convert device;
   a second lower housing space for accommodating the connecting chip of the convert interface and the terminal of the Trans Flash stick inserted into the memory stick convert device;
   a third lower housing space for accommodating the substrate of the convert interface, wherein the first lower housing space, the second lower housing space, and the third lower housing space are formed in sequence from the indention into the lower housing;
   a plurality of terminal slots, disposed in parallel on the third lower housing space for exposing the tab terminal of the convert interface; and
   an elastic chip space, formed on one side of the lower housing next to the first lower housing space and the second lower housing space for accommodating the elastic chip, the elastic chip space containing:
      a pressing portion, disposed in the central portion of the elastic chip space to press the elastic chip toward the direction of the first lower housing space and the second lower housing space; and
      an indention, disposed at the bottom of the elastic chip space at a position corresponding to the elastic chip protrusion so that the elastic chip protrusion protrudes from the elastic chip space.

12. The memory stick convert device of claim 11, wherein the height of the second lower housing space is smaller than the height of the first lower housing space.

13. The memory stick convert device of claim 11, wherein the first lower housing space further contains:
   an internal position guider, disposed in the central portion of one side thereof and acting together with the position guider of the Trans Flash stick inserted into the memory stick convert device to provide a correct insertion direction; and
   an edge, on the other side of the first lower housing space, so that the Trans Flash stick slides along the edge into the memory stick convert device.

14. The memory stick convert device of claim 10, wherein the upper housing corresponds to the lower housing and contains:
   a position guider, disposed on one corner thereof;
   a recessed portion, formed on one side of the position guider and in the central portion of the long side thereof;
   an indention, formed at the center of the lower edge thereof and having an arc recessed portion;
   a first upper housing space for accommodating the Trans Flash stick inserted into the memory stick convert device;
   a second upper housing space for accommodating the substrate of the convert interface, wherein the first lower housing space and the second lower housing space are formed in sequence from the indention into the upper housing; and
   an elastic chip space, formed on one side of the upper housing next to the first lower housing space for accommodating the elastic chip, the elastic chip space containing:
      a pressing portion, disposed in the central portion of the elastic chip space to press the elastic chip toward the direction of the first upper housing space; and
      an indention, disposed at the bottom of the elastic chip space at a position corresponding to the elastic chip protrusion so that the elastic chip protrusion protrudes from the elastic chip space.

15. The memory stick convert device of claim 14, wherein the first upper housing space further contains:
   an internal position guider, disposed in the central portion of one side thereof and acting together with the position guider of the Trans Flash stick inserted into the memory stick convert device to provide a correct insertion direction;
   an edge, on the other side of the first upper housing space, so that the Trans Flash stick slides along the edge into the memory stick convert device; and
   a terminal edge, formed at a position corresponding to the indention so that the terminal edge and the internal position guider restrict the insertion depth of the Trans Flash stick.

16. The memory stick convert device of claim 9, wherein the lower housing contains a lower housing side ridge and the upper housing contains an upper housing side ridge, the lower housing side ridge and the upper housing side ridge being formed on the left and right edges of the lower housing and the upper housing, respectively, for an assembly of the lower housing and the upper housing.

* * * * *